United States Patent [19]

Munday

[11] Patent Number: 4,852,030
[45] Date of Patent: Jul. 25, 1989

[54] TIME-OF-USE-METER WITH A CALENDAR OF CYCLIC EVENTS

[75] Inventor: Mark L. Munday, Raleigh, N.C.

[73] Assignee: Westinghouse Electric Corp., Pittsburgh, Pa.

[21] Appl. No.: 653,630

[22] Filed: Sep. 24, 1984

[51] Int. Cl.$^4$ .................... G06F 1/00; G04B 19/24
[52] U.S. Cl. .................... 364/569; 368/28; 364/492; 364/464.04
[58] Field of Search ........... 364/569, 481, 482, 483, 364/705, 715, 464, 492; 368/28; 179/2 AM, 2 TC, 6.3 R, 6.31, 7.1 R

[56] References Cited

U.S. PATENT DOCUMENTS

| | | | |
|---|---|---|---|
| 3,406,338 | 10/1968 | Benbow . | |
| 3,805,154 | 4/1974 | Halstead et al. | 324/103 R |
| 3,913,014 | 10/1975 | Halstead et al. | 324/103 R |
| 4,065,663 | 12/1977 | Edwards, II | 364/464 |
| 4,147,983 | 4/1979 | Adams et al. | 324/103 R |
| 4,156,184 | 5/1979 | Benbow | 324/103 R |
| 4,193,255 | 3/1980 | Ebihara et al. | 377/20 X |
| 4,307,341 | 12/1981 | Benbow et al. | 324/103 R |
| 4,355,361 | 10/1982 | Riggs et al. | 364/483 X |
| 4,364,009 | 12/1982 | Halstead et al. | 324/116 |
| 4,388,611 | 6/1983 | Haferd | 364/483 X |
| 4,409,685 | 10/1983 | Ricard | 377/20 |
| 4,415,271 | 11/1983 | Mori | 368/28 X |
| 4,427,300 | 1/1984 | Groothuis | 368/28 X |
| 4,573,127 | 2/1986 | Korff | 368/28 X |
| 4,585,904 | 4/1986 | Mincone et al. | 179/7.1 R X |

FOREIGN PATENT DOCUMENTS

2046925 11/1980 United Kingdom .
2069153 8/1981 United Kingdom .

Primary Examiner—Parshotam S. Lall
Assistant Examiner—Joseph L. Dixon
Attorney, Agent, or Firm—G. E. Hawranko

[57] ABSTRACT

A time-of-use meter is provided with a means for storing a plurality of identifiers that each represent a cyclic event. These cyclic events are described in such a way that a single word of storage is sufficient to represent numerous occurrences of the cyclic event over a period of many years. A microprocessor-based calendar program is provided with a means for storing a plurality of cyclic event identifiers and special event identifiers in a manner which significantly reduces the required memory storage within the microprocessor and its peripheral memory devices.

13 Claims, 2 Drawing Sheets

TIME-OF-USE-METER WITH A CALENDAR OF CYCLIC EVENTS

BACKGROUND OF THE INVENTION

The present invention is related generally to time-of-use meters and, more particularly, to a time-of-use meter which stores and responds to a plurality of cyclic dates in a manner which reduces required memory storage capacity.

Electric utility companies provide electricity for their consumers and charge those consumers according to the amount of electrical energy, measured in kilowatt hours, used during a particular period of time. Electric utility watt-hour meters are used to measure the amount of electrical power used by the consumer. By multiplying the number of kilowatt hours by the charging rate per kilowatt hour, the electric utility can determine the total bill that the consumer must pay for the usage of electric power during a particular billing period.

In recent years, providers of electric power have begun to implement multiple charging rates which can vary depending on the specific time when the electric energy is consumed. For example, some watt-hour meters are designed to record a consumer's peak electrical demand. Based partially on this peak demand, the customers billing rate is then determined. For example, U.S. Pat. No. 3,406,338 which issued on Oct. 15, 1968 to Benbow discloses a maximum demand device with a clutch that has an adjustable time and U.S. Pat. No. 3,805,154 which issued on Apr. 16, 1974 to Halstead et al. discloses an improved interval timing mechanism for a maximum demand meter. U.S. Pat. No. 3,913,014 which issued on Oct. 14, 1975 to Halstead et al. discloses a demand meter for on-peak maximum demand metering and U.S. Pat. No. 4,147,983 which issued on Apr. 3, 1979 to Adams et al. discloses a remote meter reading maximum KW demand meter. An on-peak watt hour demand meter having compensation for disc loading variations is disclosed in U.S. Pat. No. 4,156,184 which issued on May 22, 1979 to Benbow.

Rates can also vary as a function of the day of the week, season of the year or time of the day when electrical energy is consumed. Also, electrical energy usage billing rates can be set to different values for week days, weekends and holidays. Electric utility meters of this type are known to those skilled in the art as time-of-day or time-of-use meters. For example, U.S. Pat. No. 4,364,009 which issued on Dec. 14, 1982 to Halstead et al. discloses an improved clutch mechanism for time-of-day watt hour metering registers and U.S. Pat. No. 4,307,341 issued on Dec. 22, 1981 to Benbow et al. discloses an improved clutch mechanism for time-of-day meter registers.

In order to properly function as a time-of-use meter, the electric utility watt-hour meter must be provided with some means for determining the actual time of day, day of year and season. A time-of-use meter must also be able to recognize week days, weekends, holidays and season changes. Therefore, there are generally a plurality of events which can be predicted to occur during each year of use of the time-of-use meter that must be recognized by it. Although the exact number of such events can be expected to vary from utility to utility, there are approximately sixteen yearly events which the time-of-use meter must be able to recognize. For example, in a typical application, ten holiday dates, four season change dates and two dates on which daylight savings time is changed must be recognized by the time-of-use meter. Therefore, besides time-of-day rate changes, the time-of-use meter must be capable of implementing rate changes approximately sixteen times each year.

Since a time-of-use meter typically comprises a computing means, such as a microprocessor or microcomputer, it has the capability of maintaining a time keeping program which, essentially, maintains a calendar and a clock within its memory storage medium. These calendar and clock programs generally maintain data regarding the hour, minute and second of each day along with information that represents the day of the year, month, day of the month, number of days in each particular month and the year. The program would employ an algorithm that accounts for the effect of leap years and the fact that different months comprise different number of days. The computing means is able, according to known algorithms, to derive most of this information by knowing the current year and day of the year. Of course, in order to determine the day of the year at any particular time, the computing means would employ a clock program that updates the hours, minutes and seconds. The clock program is responsive to a stream of timing pulses which have a known frequency. In most typical applications, clock times are a function of a 60 hertz stream of timing pulses which is readily available in most applications.

Since electric utility watt-hour meters are, by their nature, relatively small as compared to most computer based systems, space which is available for the computing means of a time-of-use meter is severely limited. Therefore, the microprocessor, or microcomputer, along with its peripheral memory devices, must also be limited in size. Although recent advancements in the field of electronics have made available relatively large memory storage capacities in relatively small components or chips, the size of the computing means and peripheral memory devices remains a concern. For this reason, and also to reduce cost, it is beneficial to minimize the usage of computer memory as much as possible.

Prior to its initial use, a time-of-use meter must be provided with information concerning cyclical events for which a response is necessary. These cyclic events, such as the typical sixteen events described above must be known by the time-of-use meter so that it can constantly compare the current day of the year to the day of the year of each cyclic event to properly change the billing rate when required. Furthermore, electric utility companies prefer to avoid the need to reprogram their watt-hour meters on a frequent schedule.

Therefore, it is advantageous to preprogram the time-of-use meters for a significant number of years extending from its initial installation. The actual number of years for which a time-of-use meter is programmed is a function both of the desires of the electric utility companies and available memory capacity of the computing means and its associated peripheral memory devices. Some time-of-use meters are preprogrammed to contain the cyclic event date for five or more years, with some time-of-use meters being programmed for up to twenty year periods that follow the initial installation and programming.

Time-of-use meters known to those skilled in the art are, at the present time, programmed to include each individual event that is expected to occur during this preselected period of time. In other words, if a time-of-use meter is programmed for a period of twenty years and each year has sixteen cyclic dates to be remembered, the memory devices of the time-of-use meter would contain 320 individual cyclic event identifiers. Depending on the coding method that is used, the storage of 320 event dates can require 320 or more sixteen bit words of memory capacity with each word comprising 12 or 16 bits. Since, as discussed above, the available space within a time-of-use meter is limited, it is advantageous to provide the time-of-use meter with a more efficient means for remembering these multiple cyclic events over long periods of time. The present invention provides such a time-of-use meter.

SUMMARY OF THE INVENTION

The present invention provides a time-of-use meter in which most of the expected cyclic event dates are stored only once within the memory of the computing means. Each cyclic event date is stored within a single sixteen bit word of memory. The memory word is used as a cyclic event identifier. Each cyclic event identifier contains information relating to the day of the year, the function and the day of the week of a particular cyclic event. The day of the year represent a number, from 1 to 365, which precisely defines the sequential number of the day of the year for the event in relation to the beginning of the year. For example, January 4 would be the fourth day of the year and February 15 would be the forty-sixth day of the year. Of course, during leap years, any day of the year beyond the fifty-ninth day of the year would require an algorithmic adjustment when used to determine month, date, day of the week, etc. The function that must occur on a cyclic event data, which is also contained within the cyclic event identifier, relates to the particular characteristic of the event. For example, the function value permits the computing means to distinguish events which are holidays from events which are season changes or changes in daylight savings time. The day of the week portion of the cyclic event identifier contains information which relates to the fact that some holidays are celebrated on a particular day of the week which does not always exactly conform to the day of the year of the holiday. For example, it is customary to celebrate Presidents Day, Memorial Day and Columbus Day on a Monday, regardless of the actual day of the year on which these holidays occur. Similarly, for reasons of convenience, changes in daylight savings time are planned to occur at 2:00 AM on two particular Sundays during the year. Also, Thanksgiving Day always occurs on a Thursday. Other holidays, such as New Years Day, the Fourth of July and Christmas Day always occur on a particular day of the year, regardless of the day of the week on which they occur. The cyclic event identifier stores a value which informs the computing means whether each specific cyclic event is to occur on a particular day of the year or on a particular day of the week following that day of the year.

The present invention is configured to permit each cyclic event to be stored only once within the memory of the time-of-use meter regardless of the number of years planned for the meter's use. Therefore, a time-of-use meter which is to provide for fifteen cyclic events per year for twenty years would only require fifteen sixteen bit words of memory as opposed to conventional techniques which would require 300 words of memory.

In a time-of-use watt-hour meter made in accordance with the present invention, a calendar program, similar to ones known to those skilled in the art, is employed to maintain calendar data. Upon each change of the current day of the year within the calendar program, that current day of the year is compared to the values stored in a cyclic event identifier table. When one of the entries of the cyclic event identifier table matches the current day of the year, appropriate action is taken by the program within the computing means. For example, if the current day of the year matches the day of the year on which a daylight savings change is required, the computing means would then begin to monitor the hour, minute and second variables within the calendar program. In this particular case, the hour variable within the calendar routine would be changed at 2:00 AM. If, on the other hand, the current day of the year matched a cyclic event which is a holiday, the billing portion of the program changes the applicable billing rate based on a predetermined holiday rate schedule.

Although most cyclic events can easily be accommodated by the present invention as described above, one particular holiday is not as easily defined. Since Easter occurs on a date which is defined as a function of the moon's cycle, it occurs on dates which are not easily definable by the day of the year, function and day of the week values described above. Therefore, the present invention accommodates the Easter holiday, and any other special events, by storing a table of special event identifiers within its memory. Since, in normal applications of time-of-use meters, Easter is usually the only holiday which is not easily identifiable within the cyclic event identifier table of the present invention, the special event identifier table may only requires a single entry for each year of the plan period for which the time-of-use meter is preprogrammed. Therefore, in a typical installation of a time-of-use meter made in accordance with the present invention, the fifteen cyclic events described above only require fifteen memory locations regardless of the number of years planned for use of the meter and one memory location would be required for each year to store the special event identifier for Easter. Therefore, if the time-of-use meter is preprogrammed for a 20 year period, 35 memory locations would be required (i.e., 15 locations for cyclic events and 20 locations for Easter).

The present invention provides a time-of-use meter which significantly reduces the amount of memory required to store cyclic events that relate to changes in meter billing rates. Only one memory location is required for each cyclic event date, regardless of the number of years for which the time-of-use meter is preprogrammed, and special event dates are accommodated by a single sixteen bit memory location for each year for which the time-of-use meter is programmed.

BRIEF DESCRIPTION OF THE DRAWING

The present invention will be more fully understood from a reading from the Description of the Preferred Embodiment in conjunction with the drawing, in which.

DESCRIPTION OF THE PREFERRED EMBODIMENT

The present invention relates generally to time-of-use meters and, more specifically, to a time-of-use meter which is configured to store cyclic event identifiers for a plurality of events in which each cyclic event requires only one sixteen bit word of memory regardless of the number of years for which the time-of-use meter is preprogrammed.

Figure 1:
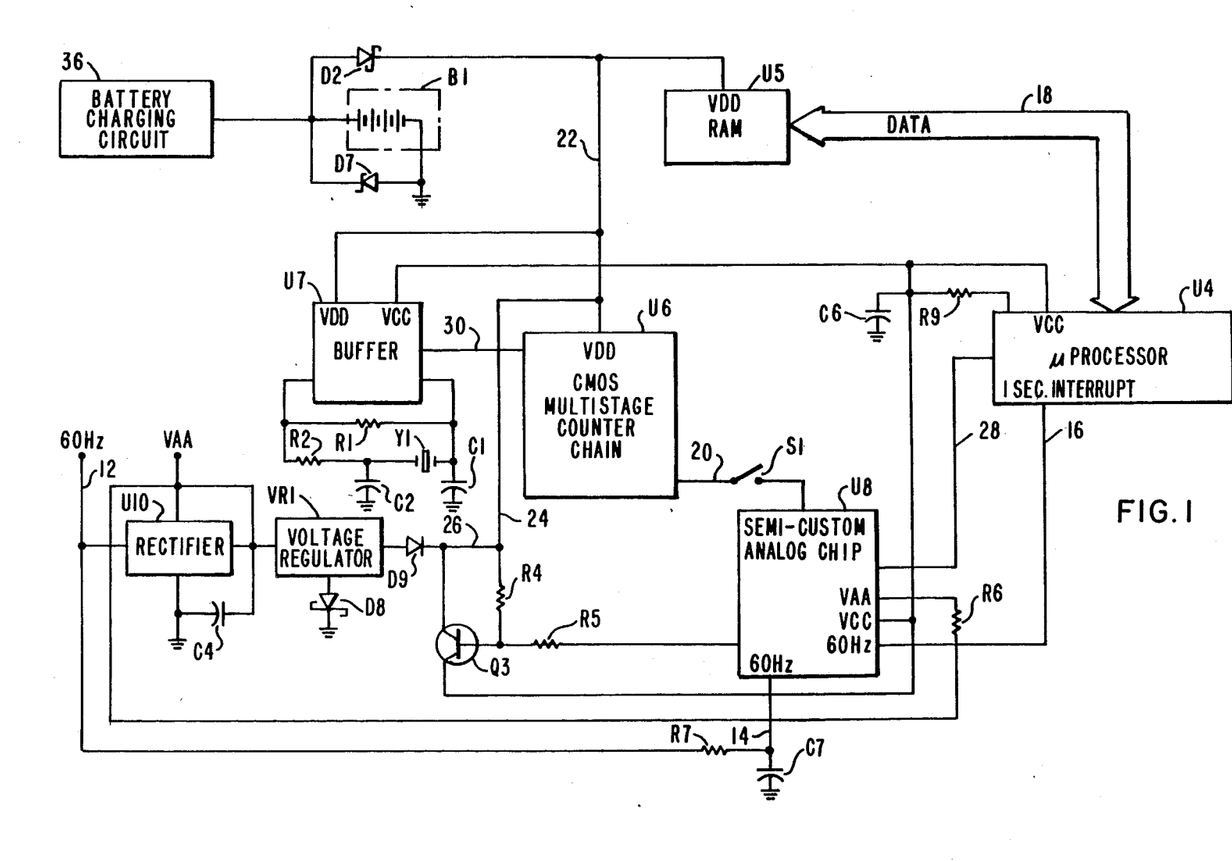
FIG. 1 is an electrical schematic of the portions of the time-of-use meter that are related to the present invention.

FIG. 1 is an electrical schematic of the components of a time-of-use meter that are pertinent to the operation of the present invention. The microprocessor U4 is used to update the calendar variable at periodic intervals of time. Depending on circumstances, the calendar variables can be updated at intervals at either one second or four seconds, depending on the availability of AC power. More specifically, when AC power is available to the time-of-use meter, the microprocessor U4 runs constantly and is responsive to one second interrupts. However, during power failures, when AC power is not available, a battery powered backup system is utilized and, to conserve power, the microprocessor U4 is activated once every four seconds to maintain the accuracy of its calendar variables.

When AC power is available, a continuous series of 60 hertz pulses is provided, on line 12, from an external source. These 60 hertz pulses are connected, by line 14, to a 60 hertz input of a semicustom analog chip U8. After being conditioned by the semicustom analog chip U8, the 60 hertz pulses pass, on line 16, to a one second interrupt port of the microprocessor U4. In a preferred embodiment of the present invention, the microprocessor U4 is type MK38P70/02 or type MK3870/40 which are available from the Mostek Corporation. This particular microprocessor U4 in a preferred embodiment of the present invention is an NMOS device with 4K bites of ROM and 64 bites of RAM and uses an F8 instruction set. It has the capability of generating an internal interrupt upon the occurrence of a predetermined number of input pulses. For example, the microprocessor U4 can readily be configured in such a way that 60 pulses on line 16 are accumulated prior to the generation of a single interrupt. This operation would be continually repeated as pulses are received from the semicustom analog chip U8. The result of this configuration would a series of one second interrupts within the microprocessor U4.

Once each second, when AC power is available, the microprocessor U4 communicates with the random access memory (RAM) U5 and reads the stored values of the calendar variables. The microprocessor U4 and RAM U5 are operatively connected by a data link 18 which enables digital data to be passed back and forth between the microprocessor U4 and the RAM U5. After the calendar data is transferred from the RAM U5 to the microprocessor U4, the seconds counter is updated to reflect the passage of one second of time since the last time the calendar data was updated. If the second counter indicates that 60 seconds have been accumulated, the minutes counter is then updated. According to methods known to those skilled in the art, the hours, day of the year, day of the month and other calendar variables are thus maintained in their proper current condition. The RAM U5, in a preferred embodiment of the present invention, is type 6514 which is available from the Harris Corporation and provides 1024X4 bits of CMOS RAM.

Crystal Y1 provides the driving frequency for an auxiliary clock system. The crystal Y1 provides a high frequency signal to a buffer U7. The buffer U7 accumulates pulses from the crystal Y1 until four second elapse. The buffer U7 is a complementary pair device that is configured as CMOS invertors. It is used in the preferred embodiment of the present invention because of its high input impedance that results in a low loading effect on the crystal Y1. The buffer U7, in a preferred embodiment of the present invention, is type MC14007 which is available from the Motorola Corporation.

The buffer U7 provides a signal to the semi-custom CMOS multistage counter chain U6. At the end of a four second interval, the multistage counter chain U6 provides a signal, on line 20, to the semicustom analog chip U8. When this signal is received by the semicustom analog chip U8, it activates the microprocessor U4 by causing the microprocessor power supply voltage VCC to be available to it. It should be understood that, when operating under the battery mode during power fail conditions, the microprocessor is only activated once every four seconds in order to conserve battery power. When activated, the microprocessor performs various functions including the updating of the calendar variables stored in RAM U5.

Upon receipt of a signal from a multistage counter chain U6, on line 20, the semicustom analog chip U8 requires a current from the base of transistor Q3, which is a PNP transistor. This base current is provided through resistor R5. Because of the existence of the base current for transistor Q3, a current is allowed to flow through lines 22, 24 and 26, to the collector of transistor Q3, and from its collector to the VCC power supply of the microprocessor U4, buffer U7 and semicustom analog chip U8. It should be understood that the portion of buffer U7 that is powered by the VCC power supply is not used in the auxiliary time base system.

When the power supply voltage VCC is provided to the microprocessor U4, it is activated and, therefore, able to begin executing its program. Upon initialization, the program within the microprocessor U4 immediately assumes that four seconds have elapsed since its last initiation. It therefore knows that the calendar data, which is stored in RAM U5, should be transferred to the microprocessor U4 and updated by a four second increment. The updated calendar data is then transferred back, via the data link 18, to the RAM U5. Following this update of the calendar data, the microprocessor U4 performs predetermined basic system maintenance functions and then checks to determine whether AC power is again available. If AC power is not available, the microprocessor U4 transmits a signal, on line 28, to the semicustom analog chip U8 to turn off the microprocessor's power supply VCC. Until the next four second interval is completed, the microprocessor U4 is inactive because its power supply voltage VCC is, intentionally, unavailable. The microprocessor is inhibited from writing faulty information to the RAM during power-up and power-down because the RAM control lines are buffered through the multistage counter chain device U6.

It should therefore be understood that, the microprocessor U4 is configured in such a way that the calendar data, which is stored in RAM U5, can be updated whether or not AC power is available to the time-of-use meter. When AC power is available to the microprocessor U4, a 60 hertz signal is provided, on line 16, and which AC power is not available, the microprocessor U4 is initiated every four seconds by the provision of its power supply voltage VCC. When the calendar data is not actively being updated, it is stored in RAM U5.

The primary function of the buffer U7, which is essentially a circuit of inverters, is to change the impedance of the crystal circuit in order to avoid loading the crystal Y1 beyond its capabilities for proper operation. Furthermore, the buffer U7 provides signals to the multistage counter chain U6 at TTL levels.

The crystal Y1 provides a continuous stream of pulses at a predetermined frequency. In a preferred embodiment of the present invention, the frequency of the crystal Y1 is 32.768 kilohertz. Crystal Y1 is a temperature stable crystal and is chosen for use in the present invention because its frequency of 32768 hertz is exactly equal to a binary number (i.e. $2^{15}$) and therefore can easily be implemented in a flip-flop chain. After passing through the buffer U7, the timing pulses are raised to TTL levels and transmitted to the multistage counter chain on line 30. The multistage counter chain U6 is a CMOS device which comprises a plurality of counters. The counters are configured in a chain association to generate a signal, on line 20, when four seconds have elapsed. This signal, on line 20, is received by the semicustom analog chip U8 and causes it to provide a base current to the transistor Q3.

Since the multistage counter chain U6 is a CMOS device, it cannot provide sufficient current for the transistor Q3. Therefore, the semicustom analog chip U8 is used to provide sufficient current to turn on transistor Q3. Transistor Q3 is type 2N2907 which is available from Teaxa Instruments Corporation.

The switch S1 which is shown located in line 20 between the multistage counter chain U6 and the semicustom analog chip U8, permits the meter to be stored for periods of time without causing a significant drain on the battery B1. In other words, unless switch S1 is closed, the signal to turn on VCC can never be sent from the multistage counter chain U6 to the semicustom analog chip U8. Therefore, although AC power is not available during periods of storage, the microprocessor U4 can be prevented from being activated by opening switch S1. When the time-of-use meter is installed, switch S1 is permanently closed.

The Schottky barrier diode D2 is connected, as shown, between the battery B1 and the voltage supply VDD on line 22. The Schottky diode D2 is a junction diode with the junction formed between the semiconductor and a metal contact rather than between dissimilar semiconductor materials as in the case of an ordinary PN diode. It essentially OR's the battery voltage and the power supply voltage VDD. When AC power is available, the power supply voltage VDD is provided by the voltage regulator VR1. Under normal operating conditions, when AC power is available, the VDD power supply has a higher potential than the battery's charging voltage minus the voltage drop of diode D2. This prevents the battery B1 from discharging. Also, during periods when AC power is available, the battery B1 is charged by the battery charging circuit 36.

When AC power is not available, the filter capacitor C4 discharges and the voltage regulator VR1 is turned off. When AC power is unavailable, the power supply voltage VDD is provided by the battery B1 and is essentially equal to the battery voltage minus the voltage drop across the Schottky diode D2.

The filter capacitor C4 is also connected, as shown in FIG. 1, to another power supply which is indicated by the reference numerals VAA. This voltage supply, VAA, is provided to the semicustom analog chip U8. Diode D8 is a diode in the ground leg of the voltage regulator VR1 that raises the voltage from the voltage regulator VR1 by approximately 0.3 volts. VAA is the unregulated supply voltage. It is obtained by a full wave rectification, provided by U10 which comprises a diode bridge, of the transformed AC power supply voltage that is filtered by capacitor C4. VDD is the non-volatile logic power supply voltage and VCC is the switched logic power supply voltage.

Although the electrical schematic of a time-of-day use watt-hour meter, illustrated in FIG. 1, has been illustrated and discussed in detail, it should be understood that the present invention is most particularly related to the microprocessor U4 and the RAM U5. The present invention comprises lookup tables which are temporarily stored in the memory of the microprocessor U4 during periods when the calendar data is being updated and the current day of the year is being compared to a plurality of cyclic or special event dates. During other times, these tables are stored in RAM U5 along with the other calendar data. Other data that is stored in RAM U5 includes register. operating constants, display identifiers, metering data, work area for fractional KWH and KW calculations, etc. Therefore, although all of the components illustrated in FIG. 1 are related to the time-of-use meter made in accordance with the present invention, the following discussion of the present invention relates most directly to the microprocessor U4 and the RAM U5.

Figure 2:
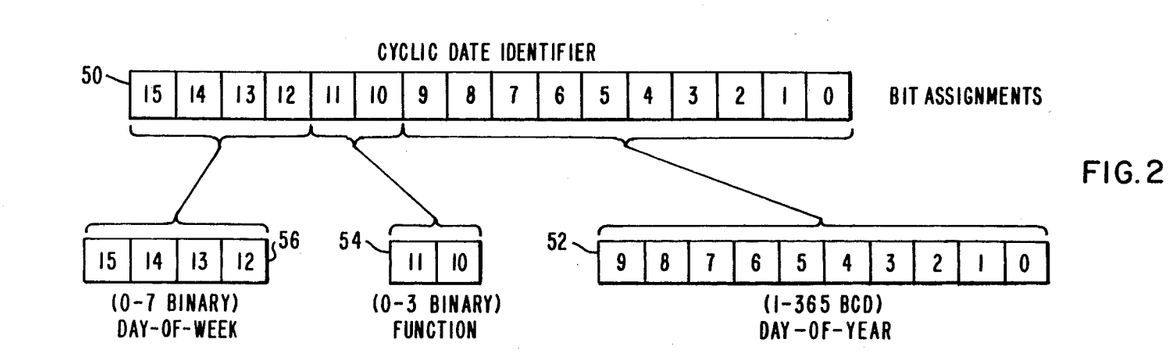
FIG. 2 illustrates the bit assignment for each cyclic date identifier of the present invention.

An important feature of the present invention is its ability to store a plurality of cyclic event dates in such a way that each cyclic event identifier contains sufficient information to be applicable in identifying the occurrence of the event regardless of the particular current year. FIG. 2 illustrates a cyclic date identifier in accordance with the present invention. The cyclic date identifier 50 is illustrated in FIG. 2 as a sixteen bit storage location, or word. It should be understood that the sixteen bits of the cyclic date identifier need not be located in contiguous bytes in a computers memory. Instead, the sixteen bits of the cyclic date identifier can comprise two non-contiguous bytes or four four-bit "nibbles" of memory which are capable of being associated together during data comparison operations within the microprocessor U4. Ten of the bits of the cyclic date identifier are used to store the day of the year associated with a particular cyclic event. These day of the year bits 52, in a preferred embodiment of the present invention, contain a binary coded decimal (BCD) representation of the day of the year that is associated with a particular cyclic event. It should be understood that the day of the year is stored as a BCD value because, in a preferred embodiment of the present invention, it is convenient to do so. When stored as a BCD value, the day of the year can be used directly with display devices without the requirement of converting from another notation, such as binary, to BCD. However, it should be further understood that the day of the year could be stored as a binary representation in an alternate embodiment of the present invention. The BCD representation of the day of the year, as shown in FIG. 2, is stored in bits 0-9 of the cyclic date identifier.

Bits 10 and 11 of the cyclic date identifier 50 are used to store a function descriptor for the particular cyclic event associated with each cyclic date identifier 50. These two bits 54 are able to store a binary value from 0 to 3 and can therefore be used to represent one of four unique functions. These functions identify the associated cyclic event as being a holiday, a daylight savings time forward adjustment DSTS, a daylight savings time backwards adjustment DSTR or a seasonal change.

Bits 12–15 of the cyclic date identifier 50 are used to store a day of the week value. These bits 56 contain a value from 0 to 7. If these bits 56 are equivalent to a binary 0, their status indicates that the associated cyclic event is to take place exactly on the day of the year represented by bits 52. However, if a non-zero value is stored in bits 56, the cyclic event is scheduled to occur on a specific day of the week which falls on or follows the day of the year represented by bits 52.

Figure 3:
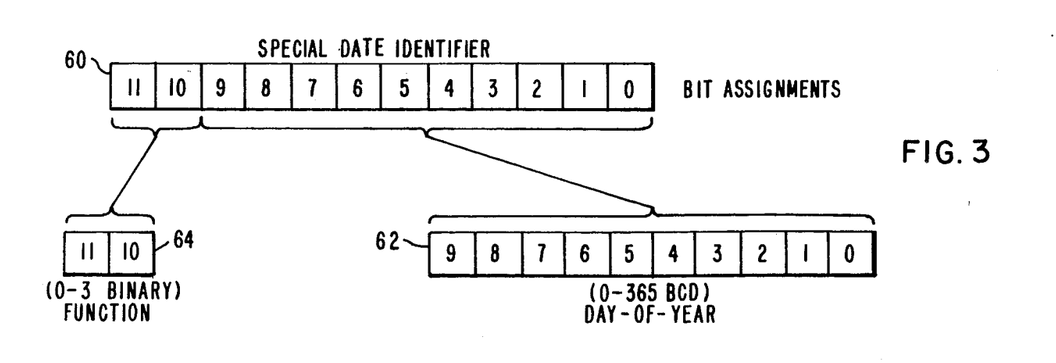
FIG. 3 illustrates the bit assignments for the special date identifiers of the present invention.

FIG. 3 illustrates an exemplary special date identifier used in accordance with the present invention. The first ten bits 62 of the special date identifier are used to store a BCD representation of the day of the year related with the associated special event. These bits 62 are used in a way which is very similar to bits 52 of the cyclic date identifier 50 shown in FIG. 2, however, a day of the year that is equal to zero is permitted in the special date identifier 60. Bits 10 and 11 (reference numeral 64 in FIG. 3) of the special date identifier represent a binary value from 0 to 3 that is used to indicate the four functions which are described in relation to bits 54 in FIG. 2.

The present invention will now be described in relation to an exemplary application of the preferred embodiment. This discussion will relate to FIGS. 1–3 and the tables illustrated below. Table 1 illustrates the eight possible values of the day of the week portion 56 of the cyclic date identifier 50 shown in FIG. 2.

TABLE I

| DAY OF THE WEEK NOTATION | |
|---|---|
| BINARY VALUE | DAY OF WEEK |
| 0 | Actual Day of Year |
| 1 | Saturday on or After Day of Year |
| 2 | Friday on or After Day of Year |
| 3 | Thursday on or After Day of year |
| 4 | Wednesday on or After Day of Year |
| 5 | Tuesday on or After Day of Year |
| 6 | Monday on or After Day of Year |
| 7 | Sunday on or After Day of Year |

When the binary value of the day of the week bits 56 are equal to zero, the associated cyclic event will be assumed to occur exactly on the day of the year represented by the BCD value stored in bits 52. However, when the day of the week value is a non-zero number, the cyclic event will be observed on a particular day of the week on or after the day of the year represented by bits 52. For example, if the day of the week bits 56 contain a 3 and the day of the year bits 52 contain a BCD value 154, the cyclic event will be assumed to occur on the Thursday on or immediately following the 154th day of the year. Similarly, the other non-zero values of the day of the week bits 56 would indicate that the cyclic date will occur on some prescribed day of the week following the occurrence of the day of the year indicated in bits 52 as indicated in Table I.

As discussed above, the function bits, 54 and 64, are used to describe a particular function that occurs on the cyclic or special event date. Table II illustrates the four functions which can be represented by the function bits.

TABLE II

| FUNCTION NOTATION | |
|---|---|
| BINARY VALUE | FUNCTION |
| 0 | Holiday |
| 1 | DST Adjust Forward at 2:00 AM |
| 2 | DST Adjust Backward at 2:00 AM |
| 3 | Season Change |

If bits 10 and 11 of the cyclic or special event identifiers are equal to zero, the event is assumed to be a holiday. Similarly, if the function bits, 54 or 64, are equal to a binary 1, the event is assumed to be the day on which daylight savings time is adjusted forward at 2:00 AM. If these functions bits are equal to 2, the event is the adjustment of the daylight savings time backward at 2:00 AM. Finally, if the function bits are equal to 3, the event is a season change.

Since once cyclic date identifier is used to represent a single event, a plurality of cyclic date identifiers can be associated in a table to represent a plurality of cyclic events. Table III illustrates an exemplary table of cyclic date identifiers.

TABLE III

| TABLE OF CYCLIC DATE IDENTIFIERS | | | | |
|---|---|---|---|---|
| Stored Value (Hexadecimal) | Day-of-Year | Function | Day-of-Week | Description |
| "0001" | 001 | Holiday | | New Year's Day |
| "6046" | 046 | Holiday | Monday | Presidents Day |
| "0C80" | 080 | SC | | Season Change |
| "7514" | 114 | DSTS | Sunday | DSTS Adjust Forward at 2:00 AM |
| "6145" | 145 | Holiday | Monday | Memorial Day |
| "0D72" | 172 | SC | | Season Change |
| "0185" | 185 | Holiday | | Fourth of July |
| "6244" | 244 | Holiday | Monday | Labor Day |
| "0E66" | 266 | SC | | Season Change |
| "6281" | 281 | Holiday | Monday | Columbus Day |
| "7A98" | 298 | DSTR | Sunday | DSTR Adjust Backward at 2:00 AM |
| "0315" | 315 | Holiday | | Veterans Day |
| "3326" | 326 | Holiday | Thursday | Thanksgiving Day |
| "0F52" | 352 | SC | | Season Change |
| "0359" | 359 | Holiday | | Christmas Day |

The first column in Table III illustrates the actual values that will be stored in the memory of the microprocessor U4 and the RAM U5. They are shown in Table III as hexadecimal values, it should be understood that each of these values represents a sixteen bit memory location of which the first fifteen bits are used. The Table of Cyclic Date Identifiers, Table III, represents fifteen events of which nine are holidays, four are season changes and two are daylight savings time changes. These functions, which are shown in the third column of Table III, are represented by bits 10 and 11 of the stored value shown in column 1. The day of the year, shown in column 2 of Table III, is stored as a BCD value in bits 0-9 of the associated cyclic date identifier.

The day of the week column of Table III illustrates that seven of the fifteen events are to occur on a particular day of the week. In these seven instances, bits 12-15 of the cyclic date identifier contain a value from 1 to 7. For example, bits 12-15 of the cyclic event identifier for Memorial Day contains a binary value of 6 which represents the fact that Memorial Day is to occur on the Monday on or following the 145th day of the year. Using Memorial Day as a specific example, it should be understood that the holidays which are to occur on a specific day of the week will, more often than not, occur on a day of the year other than the particular day of the year represented by bits 0-9 of the cyclic event identifier. Therefore, the events which are to occur on a specific day of the week must have their day of the year carefully chosen so that it will always represent a day within the six days preceding the actual event.

The fifteen entries of the Table of Cyclic Date Identifiers, illustrated in Table III, accurately describe the exact day on which an event is to occur regardless of the year. In other words, the cyclic date identifiers will accurately describe the day on which the fifteen events will occur for a significantly long period of time. No ther additional storage is required to maintain the cyclic event date.

Of course, it should be understood that the occurrences of leap years must be taken into account when comparing the actual calculated day of the year to the entries in the Table of Cyclic Date Identifiers. However, this is a relatively simple task. Since the microprocessor U4 has means for determining the existence of a leap year, it can merely adjust the current day of the year by one, during leap years, prior to comparing that current day of the year to the entries in the Cyclic Date Identifier Table. Of course, this adjustment is only required if the day of the year is greater than 60.

The advantages of the present invention can readily be seen by observing Table III and comparing it to the fact that methods presently known to those skilled in the art require each event to be represented by a word of memory for each of its yearly occurrences over the period of expected use of the time-of-use meter. For example, if the time-of-use meter is to be preprogrammed for a period of 20 years, the present invention reduces the required memory storage location by 95% (i.e., 15 words instead of 300 words)!

Although each of the events described in the above discussion of Table III can be represented as a cyclic event in such a way that the representation is valid for many years in the future, certain events do not readily lend themselves to such a simple description because they are not truly cyclical. For purposes of this discussion, these types of events are referred to as special events. A common example of a special event is Easter. Easter is always the first Sunday after the first full moon that falls on or after the vernal equinox (March 21 of the Gregorian calendar). If this full moon happens to occur on a Sunday, Easter is celebrated on the following Sunday. Easter Sunday cannot be earlier than March 22 or later than April 25. Therefore, the occurrence of this special event (i.e., Easter Sunday) does not easily fit within the methodology described above in relation to Table III. Some other means must be provided to inform the time-of-use meter of the actual date on which Easter is to be observed. Table IV illustrates an exemplary table of special date identifiers that is used in a time-of-use meter made in accordance with the present invention.

TABLE IV

TABLE OF SPECIAL DATE IDENTIFIERS

| Stored Value (Hexadecimal) | Day-of-Year | Function | Description | |
|---|---|---|---|---|
| "113" | 113 | Holiday | Easter | April 22, 1984 |
| "097" | 097 | Holiday | Easter | April 7, 1985 |
| "089" | 089 | Holiday | Easter | March 30, 1986 |
| "000" | 000 | Year Change | | |
| "109" | 109 | Year Change | Easter | April 19, 1987 |
| "094" | 94 | Holiday | Easter | April 3, 1984 |
| "085" | 85 | Holiday | Easter | March 26, 1989 |
| "000" | 000 | Year Change | | |
| "105" | 105 | Holiday | Easter | April 15, 1990 |
| "090" | 90 | Holiday | Easter | March 31, 1991 |
| "000" | 000 | Year Change | | |
| "110" | 110 | Holiday | Easter | April 19, 1991 |
| "000" | 000 | Year Change | | |
| . | . | . | | |
| . | . | . | | |
| "000" | 000 | Year Change | | |

As discussed above, the special date identifiers 60 are very similar to the cyclic date identifiers. The significant difference between these two types of identifiers is that the special date identifiers do not have bits 12-15.

Although Table IV only depicts the Easter holidays and year changes within its structure, it should be understood that other special events could easily be incorporated within it. One apparent difference between Tables III and IV is that, due to its purpose, the entries in Table IV for the day of year are the actual day of the year on which the event is to occur.

Since values for each of the special events represents the actual day of the year when the event is to occur, there is no need to indicate the actual day of the week on which the event will occur. The day of the year bits of each of the entries in the Table of Special Date Identifiers can be used to indicate the actual day of the year on which the event will occur because each yearly occurrence of the special event (i.e., Easter Sunday) is recorded individually in the Table of Special Date Identifiers. No attempt is made to utilize a single memory location to represent more than one particular occurrence of the special event. This illustrates one of the specific differences between Tables III and IV. It further indicates the significant difference between the present invention and time-of-use meters presently known to those skilled in the art. The representation shown in Table IV is only used in the present invention to represent a small minority of special events. However, in time-of-use meters presently known to those skilled in the art, the technique illustrated in Table IV is used to represent all events, whether cyclic or not. Therefore, by comparing Tables III and IV, the significant reduction of required memory storage can readily be seen.

As can be seen in Table IV, some of the entries in the first column are equal to zero. The use of these zero locations will be discussed in greater detail below. However, they can essentially be considered to represent the occurrence of a new year, or year change. The zero locations in column 1 of Table IV serve an important purpose in a time-of-use meter made in accordance with the present invention. These zero locations can be seen to occur between the Easter events of 1986 and 1987, 1989 and 1990 and 1991 and 1992. In order to understand the valuable purpose of these zero locations, the method of comparison of the current day of the year to those days of the year represented in Table IV must be understood.

When the time-of-use meter is initialized and installed, it is set to a specific current day of the year in a specific current year. The program within the microprocessor would then compare the current day of the year to the first entry in Table IV. If the actual current day of the year is less than the first entry (i.e., 113) a pointer would remain unchanged and the computer would make the decision that this special event (Easter Sunday on Apr. 22, 1984) has not yet occurred. No further checks of the Table would be made. On day of the year 113, a match would be discovered between the current day of the year and the first entry in Table IV. At that point, appropriate action would be taken in response to this occurrence of a special event. The computer would then move its pointer to the next entry in the Table (i.e., Easter Sunday on Apr. 7, 1985.) However, as the current day of the year progressed from day 114 through day 366, no matches would occur with this second entry in the special date identifier table. When the day of the year is again set to 1, on New Year's Day of 1985, and sequentially incremented upward on each new day, a match will eventually occur when the day of the year reaches 97. This process would continue as the computer's pointer is sequentially moved downward through Table IV. However, a problem can occur if no zero entries are included within the table.

For the purpose of explaining this feature, it assumed that the third and fifth entries (i.e., "0089+ and "0109") do not have a zero between them. On Mar. 30, 1986, the computer would match the current day of the year (i.e., 89) with the third entry in Table IV. The pointer would then be moved to the next entry in the Table which, for purposes of this illustration, will be assumed to be the "0109" for Easter Sunday on Apr. 19, 1987. After the pointer is moved to this entry in Table IV, the day of the year counter would continue to proceed upward from 89 to 90 and so on 20 days later, on the 109th day of the year, a match would occur when the current day of the year is compared to the entry in Table IV representing Apr. 10, 1987. This would lead to the unfortunate result of celebrating Easter twice in the same year. The cause of this problem is that the day of the year for Easter on Mar. 30, 1986 is less than the day of the year for Easter on Apr. 19, 1987. To avoid this deleterious result, a zero is entered in the Table at occurrences where Easter falls on successively higher days of the year in successive years. As can be seen in Table IV, this occurs three times. The insertion of the zero value between these successive Easters requires the computer to observe a year change prior to looking for a match with the next entry in the table.

It should be clearly understood that, although Table IV is limited to only the Easter holiday as an example, other special non-cyclic dates can easily be included within it. These special dates would be any event that cannot be readily adapted to the methodology discussed above in conjunction with Table III. One example of how the special date identifiers can be used for an event other than Easter is when a Cyclic date, such as Christmas, requires special treatment. As a hypothetical example, if it is desirable to celebrate Christmas on a Monday when December 25 falls on a Sunday, the Cyclic Identifier Table and the Special Event Identifier Table can be used in conjunction with each other to accomplish this. It is a simple matter to have the computer program negate Cyclic dates when the same date appears in both the Cyclic and the Special Identifier Tables. Then, by entering the December 25 date in the Special Event Identifier Table when it falls on a Sunday and also entering the following December 26 date in the Special Event Identifier Table for the particular year on which December 25 falls on a Sunday, the time-of-use meter can avoid celebrating Christmas on the December 25 date (i.e. on Sunday) and celebrate it on the following Monday. It should be understood that this hypothetical example is used only for illustration purposes and does not represent an actual situation that is normally observed. It is merely intended to illustrate a situation where the Special Event Identifier Table can be used to negate the Cyclic Event Identifier Table entry when this negation is advantageous.

The Cyclic and Special Event Identifier Tables, illustrated in Tables III and IV, are stored in RAM U5 and transferred back and forth between RAM U5 and the microprocessor U4 when their values are to be compared with the current day of the year. As discussed above, the microprocessor, either on one or four second intervals, updates the calendar data in order to keep these calendar variables accurate and up-to-date. Upon each change of the day of the year variable, the microprocessor U4 would transfer the Cyclic and Special Event Identifier Tables, one at a time, from RAM U5 into its active memory and make the necessary comparisons. When the comparison results in a match between the current day of the year and the appropriate event identifier, the microprocessor U4 takes the action indicated by the function bits, 54 or 64. For example, if the function bits indicate that a holiday is occurring, the appropriate billing rate for a holiday is chosen for the calculation of electrical energy consumption charges. Similarly, if a season change is indicated by the function bits, the appropriate billing rates would be altered within the microprocessor U4 and RAM U5. A slightly different action is indicated if the function bits indicate that a daylight savings time change is required. The microprocessor U4 would, in that event, wait until 2:00 AM and then would change the hour variable of the calendar data either forward or backward, as indicated.

The present invention provides a time-of-use meter that enables cyclic events to be represented in a manner that minimizes required memory storage. A single sixteen bit word is used to represent each of the cyclic events regardless of the period of time for which a time-of-use meter is preprogrammed. For time-of-use meters that are preprogrammed for 20 years, for example, the required memory storage for cyclic events is reduced by 95%. Furthermore, the present invention allows special events to be stored in cases where the event is not readily adaptable to the cyclic event identifier methodology of the present invention.

The present invention has been illustrated in FIG. 1 in relation to particular components. Although it should be understood that alternative embodiments of the present invention could incorporate different combinations of components, the particular types or values of the components illustrated in FIG. 1 are described in Table V.

TABLE V

| Reference Numeral | Type or Value |
| --- | --- |
| U4 | Type MK38P70/02 or 3870/40 |
| U5 | Type 6514 or 6541 |
| U6 | Type 2746 |
| U7 | Type MC14007 |
| U8 | Type MDA2753 |
| U10 | Type GIDF02 |
| D2 | Type ITS5817 |
| D7 | Type IN4736A |
| D8 | Type 1N6263 |
| D9 | Type IN4004 |
| C1 | 10 pf |
| C2 | 10 pf |
| C4 | 470 μf |
| C6 | .1 μf |
| C7 | .1 μf |
| R1 | 18 mΩ |
| R2 | 510 kΩ |
| R4 | 22 kΩ |
| R5 | 510 Ω |
| R6 | 2 kΩ |
| R7 | 2 kΩ |
| R9 | 6.2 kΩ |
| VR1 | Type UA7806UC |
| Y1 | 32.768 KHz |
| Q3 | Type 2N2907A |

Although the present invention has been illustrated and described with significant specificity and with particular reference to specific components, it should not be considered to be so limited. Alternative embodiments of the present invention should be considered to be included within its scope.

What I claim is:

1. A time of use apparatus for an electric meter, comprising:

a computer;

means for providing a series of pulses, said series of pulses having a preselected frequency, said providing means being operatively connected to said computer; means for formatting data within a storage device relating to a plurality of event dates, said formatting means comprising means for indicating the day of the year of each of said plurality of event dates, means for defining a function associated with each of said plurality of event dates and means for indicating the occurrence of a preselected one of said plurality of event dates on a particular day of the week, said formatting means being independent of the calendar year;

said computer including means for deriving a calculated day of the year, said deriving means being responsive to said providing means; and said computer further including means for comparing aid calculated day of the year to the day of the year of the vent dates of said formatting means.

2. The apparatus of claim 1, wherein:

each of said plurality of event dates is represented by the combined logic states of fifteen binary digits within said storing means.

3. The apparatus of claim 1, wherein:

said preselected frequency is 60 Hz.

4. The apparatus of claim 1, wherein:

said deriving means is actuated once every second.

5. The apparatus of claim 1, wherein:

said deriving means is actuated once every four seconds.

6. A time of day meter, comprising:

a computer;

means for providing a stream of pulses which are input to said computer, said steam of pulses having a preselected frequency;

means, responsive to said stream of pulses, for measuring time, said time measuring means comprising means for determining the current hour, current minute, and current day of the year;

means for denoting a plurality of events, said denoting means comprising means for indicating the day of the year for each of said plurality of events and means for defining the functional characteristic of each of said plurality of events; and said computer including means for comparing said current day of the year to said day of the year of said denoting means for a preselected one of said plurality of events.

7. The meter of claim 6, further comprising:

means for representing a particular day of the week for a preselected one of said plurality of events, said denoting means comprising said representing means.

8. The meter of claim 6, wherein:

said time measuring means is activated at one-second intervals when external electrical power is available to said meter and at four-second intervals when external electrical power is not available to said meter.

9. Apparatus for responding to cyclic events, comprising:

a microcomputer;

means for providing a periodic signal as an input to said microcomputer, said periodic signal having a preselected frequency;

means responsive to said periodic signal for recording the passage of time, said recording means being configured to record current hour, current minute and current day of the year;

means for storing a plurality of cyclic event identifiers, each of said cyclic event identifiers comprising the day of the year and functional description of a preselected one of a plurality of cyclic events;

each of said plurality of cyclic event identifiers being represented by at most, sixteen binary digits of a solid state memory device; and said microcomputer including means for comparing said current day of the year with a preselected one of said plurality of cyclic event identifiers.

10. The apparatus of claim 9, further comprising;

means for indicating that a preselected one of said plurality of cyclic events is to occur on a specific day of the week, said indicating means being included in each of said plurality of cyclic events.

11. The apparatus of claim 9, wherein:

each of said plurality of cyclic event identifiers comprises means for providing an indication that an associated event will occur on a particular day of the week, said indication being algorithmically related to said day of the year of said associated event.

12. The apparatus of claim 9, further comprising:

means for retaining said plurality of cyclic event identifiers when said comparing means is inactive.

13. The apparatus of claim 12, wherein:

said retaining means is a random access memory device cooperatively associated with said microcomputer.

* * * * *